(12) United States Patent
Vanden Brande (10) Patent No.: US 9,458,533 B2
(45) Date of Patent: Oct. 4, 2016

(54) METHOD AND DEVICES FOR CONTROLLING A VAPOUR FLOW IN VACUUM EVAPORATION

(75) Inventor: Pierre Vanden Brande, Löhningen (CH)

(73) Assignee: ADVANCED GALVANISATION AG, Neuhausen (CH)

(*) Notice: Subject to any disclaimer, the term of this patent is extended or adjusted under 35 U.S.C. 154(b) by 956 days.

(21) Appl. No.: 12/809,724

(22) PCT Filed: Dec. 22, 2008

(86) PCT No.: PCT/EP2008/068202
§ 371 (c)(1),
(2), (4) Date: Jun. 21, 2010

(87) PCT Pub. No.: WO2009/083546
PCT Pub. Date: Jul. 9, 2009

(65) Prior Publication Data
US 2010/0272921 A1    Oct. 28, 2010

(30) Foreign Application Priority Data

Dec. 21, 2007  (BE) .................................. 2007/0618
Jan. 23, 2008  (EP) .................................. 08150579

(51) Int. Cl.
C23C 14/54 (2006.01)
C23C 14/24 (2006.01)
C23C 14/32 (2006.01)
C23C 14/16 (2006.01)
C23C 14/56 (2006.01)

(52) U.S. Cl.
CPC ............. *C23C 14/16* (2013.01); *C23C 14/246* (2013.01); *C23C 14/32* (2013.01); *C23C 14/542* (2013.01); *C23C 14/562* (2013.01); *C23C 14/24* (2013.01); *C23C 14/243* (2013.01)

(58) Field of Classification Search
CPC .. C23C 14/562; C23C 14/243; C23C 14/246
USPC .......................................................... 118/718
See application file for complete search history.

(56) References Cited

U.S. PATENT DOCUMENTS

| 4,278,528 A * | 7/1981 | Kuehnle et al. ......... 204/298.11 |
| 5,584,973 A | 12/1996 | Wada et al. |
| 2002/0050530 A1* | 5/2002 | Stefano et al. ............. 236/49.3 |
| 2004/0026234 A1* | 2/2004 | Vanden Brande et al. ....................... 204/192.12 |

FOREIGN PATENT DOCUMENTS

| EP | 1182272 A | 2/2002 |
| JP | 58133374 A | 8/1983 |
| JP | 10152777 A | 6/1998 |

* cited by examiner

*Primary Examiner* — Keath Chen
*Assistant Examiner* — Aiden Lee
(74) *Attorney, Agent, or Firm* — Browdy and Neimark, PLLC (57) ABSTRACT

The invention relates to a method and a device for the coating of running substrates (25) moving along a run direction through a treatment zone (6), in which the vapor of a coating material is generated in a chamber (5), this vapor passing through a treatment aperture towards the treatment zone (6) where the coating material condenses on the surface of the substrates (25). The vapor flow through the treatment aperture is controlled by adjusting the extent to which the treatment aperture is shut off by at least one shutter (13), between an open position, in which said vapor flows through the treatment aperture towards the treatment zone (6), and a closed position, in which the vapor is prevented from flowing towards the treatment zone (6) through the treatment aperture.

13 Claims, 4 Drawing Sheets

METHOD AND DEVICES FOR CONTROLLING A VAPOUR FLOW IN VACUUM EVAPORATION

1. GENERAL DESCRIPTION OF THE INVENTION

The invention relates to a method and device for the coating of running substrates, moving in a direction of travel, this device comprising a confinement enclosure in which a source of vapour of the coating material is present and having a treatment zone communicating with the source of vapour through at least one treatment opening. The source of vapour makes it possible to generate a flow of vapour for coating a substrate. The invention therefore concerns a device and method for controlling a flow of vapour towards a substrate to be coated in a vacuum evaporation coating method. The invention is particularly advantageous for the control and regulation of a flow of zinc vapour, obtained by evaporation of the metal, towards steel substrates in the form of strips, girders, plates, profiles, with all types of transverse sections, but also parts disposed on supports, for example hooks or metal baskets, transported in the coating zone.

Although the control of the flow of evaporated vapour that is the subject matter of the invention is completely independent both of the nature of the substance evaporated and the type of evaporation used, it is particularly well suited to the control and regulation of a flow of zinc vapour towards the substrate to be coated in a method of galvanisation by zinc plasma evaporation. The coating material contained in the vapour source may for example be heated by Joule effect or induction or by plasma in order to make this material evaporate.

The galvanisation method by zinc plasma evaporation is already known and described in the document WO 02/16664. This method uses a retention vessel for maintaining a certain quantity of zinc in the liquid state and evaporating by means of a plasma produced in the zinc vapour by on average negatively biasing the liquid zinc with respect to a counter-electrode, in particular an anode. The counter-electrode may be formed by the substrate to be coated. The retention vessel is supplied with liquid zinc via a supply tube immersed in a reserve of zinc maintained in a vacuum furnace situated in a vacuum enclosure, isolated from any passage of gas towards the galvanisation vacuum tank, and in which, by regulating the gas pressure, it is possible to regulate the level of liquid zinc in the retention vessel situated in the vacuum tank where the galvanisation takes place. The plasma produced in the zinc vapour is generally obtained by means of a magnetron discharge by means of a magnetic circuit disposed under the retention vessel. The zinc vapour tension above the retention vessel depends on the electrical power dissipated at the surface of the liquid zinc and fixes the weight of zinc that it is possible to deposit per unit of time on the steel substrate. This vapour tension may be as much as several mbar corresponding generally to a mass of zinc evaporated of several kg/min. It is therefore recommended, as already described in the document WO 02/16664, to provide a confinement enclosure with heated walls in order to prevent the zinc vapour contaminating the whole of the installation by condensing over all the cold surfaces, which are generally at ambient temperature, other than those of the substrate. Entry and exit openings are provided in this confinement enclosure in order to enable the substrate to be coated to pass through it. The zinc coating is therefore obtained by condensation of the zinc vapour, directly in the solid state on the cold surface of the substrate passing through the confinement enclosure. The temperature of the surface of the substrate is typically below 150° C.

It will easily be understood that it is necessary to be able to adapt the electrical power delivered to the plasma and dissipated, via bombardment by ions issuing from the plasma, on the surface of the liquid zinc in the retention vessel according to the area of the steel substrate passing per unit of time through the confinement enclosure. In particular, cutting this electrical supply where no substrate is present, or is not passing, in the confinement enclosure, and conversely triggering and progressively increasing the electrical power dissipated on the surface of the liquid zinc when the substrate enters, or begins to pass in, the confinement enclosure. This is done so as not only to ensure a uniform thickness of zinc on the surface of the substrate but in particular to limit the losses of zinc through the entry and exit openings of the confinement enclosure when no substrate is passing through the confinement enclosure. This is because, apart from the economic loss, in terms of zinc and energy, the zinc contamination may seriously damage the galvanisation installation by plasma evaporation if it is not controlled.

The use of a confinement enclosure as described in the prior art has several disadvantages.

This is because, when no substrate is present or passing through the confinement enclosure, even if the electrical supply enabling zinc to be evaporated by plasma heating is cut off, for example, the liquid zinc contained in the retention vessel continues to evaporate because of the heat stored in the metal during normal functioning of the process. This zinc vapour is therefore liable to escape freely through the entry and exit openings of the confinement enclosure or to condense on an immobile substrate. To limit this loss of zinc towards the outside of the confinement enclosure, or the condensation of the zinc on an immobile substrate, a simple means could consist of emptying the retention vessel of any presence of liquid zinc and returning it to the liquid zinc reserve situated in the temperature-maintenance furnace in the tank situated under the galvanisation tank. Unfortunately, the transient time necessary for the entry or exit of a substrate to or from the confinement enclosure, or the stoppage or restarting of the passage of the substrate, is generally much less than the time necessary for filling and draining the retention vessel with liquid zinc through its feed tube. Consequently this solution cannot be envisaged in practice.

Moreover, when any substrate is passing through the confinement enclosure, the confinement enclosure, as described in the prior art, does not make it possible to adapt the flow of zinc according to the various faces of the substrate to be coated. This could be important for the purpose of ensuring uniform deposition of the entire substrate whereas the area of the surface of the substrate to be coated varies with the orientation of the vapour flow, as is for example the case with a girder with an I-shaped or U-shaped cross section. It is also not possible to coat the substrate with different thicknesses on its different faces, for example, when it is wished to apply a coating with a certain thickness to one of the faces of a steel sheet that is different from the thickness of the coating applied to the other face of this sheet.

The method and devices of the subject matter of the invention aim essentially to solve among other things, these two drawbacks by making it possible:

to isolate the inside of the confinement enclosure from the treatment zone where the substrate to be coated is passing. This function is activated when no substrate is traversing the treatment zone or travelling through this treatment zone;

to regulate the vapour flow according to its orientation towards the substrate transversely with respect to the direction of travel, or according to the position of the vapour source in the confinement enclosure with respect to the treatment zone, by regulating at least one vapour obturation element.

To this effect, regulation means are provided for controlling the flow of said vapour between the vapour source and the treatment zone through said treatment opening. These regulation means comprise obturation elements able to be moved between an open position in which the flow of said vapour can pass through the treatment opening towards the treatment zone, and a closed position in which the treatment zone is isolated with respect to the vapour source.

In a particularly advantageous configuration of the invention, a passage extends in the direction of travel of the substrates between an entry opening and an exit opening of the confinement enclosure, said treatment zone being situated in this passage and the regulation means being such as to make it possible to control the flow of said vapour between said vapour source and the inside of the passage.

The entry and exit openings of the confinement enclosure are thus connected together by a passage in the form of a tube passing completely through the confinement enclosure and having opening and closing devices enabling vapour to pass from the inside of the confinement enclosure towards the treatment zone through which the substrate is passing. When no substrate is traversing or travelling through the treatment zone, all the openings of this tube passing right through the confinement enclosure are closed off. When a substrate is passing through the treatment zone, the openings in the passage are more or less open according to the flow of vapour desired in line with each of them towards the substrate.

A device for heating, for example by Joule effect, the wall of the confinement enclosure is provided and sized so as to achieve a wall temperature sufficient to prevent any solid or liquid condensation of the metal vapour on said walls. This system for heating the confinement enclosure can also advantageously enable, by radiation, the maintenance at the same temperature, preventing any condensation of the zinc vapour, of the walls making up the passage for regulating the flow of vapour passing through the confinement enclosure. This makes it possible to simplify the design of the vapour flow regulation device, which can simply make use of a simple mechanical construction consisting of obturation elements, generally of any geometry, able to be moved between an open position, in which the flow of said vapour can pass through the treatment opening towards the treatment zone, and a closed position in which the treatment zone is isolated with respect to the vapour source generally with any geometry.

It is clear that the invention is not limited to a plasma galvanisation device and to a confinement enclosure through which a passage in the form of a tube with adjustable obturation elements passes right through. This is because vacuum evaporation could be obtained by any means of heating by means of generally any vapour source. The material is not limited to zinc. Other metals such as magnesium, for example, or organic molecules with a view to depositing polymers are possible. The system of adjustable obturation elements is not necessarily formed by a tubular structure passing right through the confinement enclosure, but could also have a flat geometry closing off a treatment opening formed in a wall of the confinement enclosure and facing an area of the substrate to be coated.

2. DESCRIPTION OF THE FIGURES

Other details and particularities of the invention will emerge from the description given below by way of non-limitative example of a particular embodiment of the device and method according to the invention with reference to the accompanying drawings.

In the various figures, the same reference signs refer to analogous or identical elements.

3. DETAILED DESCRIPTION OF THE INVENTION

Figure 1:
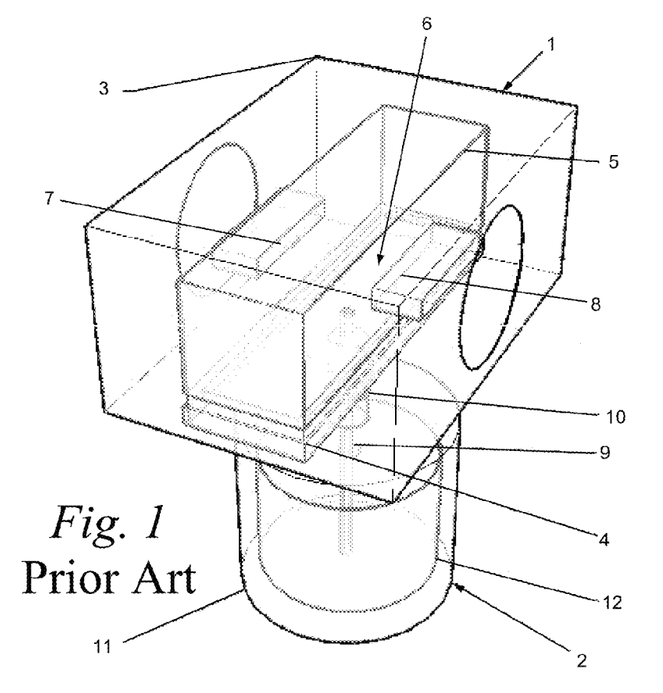
FIG. 1 shows, in perspective, a plasma galvanisation device, as described in the prior art.

As shown in FIG. 1, the galvanisation device according to the prior art consists of top equipment 1 through which the substrate to be coated passes and bottom equipment 2 comprising a liquid zinc reserve.

The top equipment 1 comprises a vacuum chamber 3 in which there is arranged a vapour source formed by a retention vessel 4 surmounted by a confinement enclosure 5. The confinement enclosure has heated walls in order to prevent the deposition of vapour on these walls and is tubular in shape enabling steam to circulate freely and be distributed all around the product to be coated without any leakage of vapour in a direction transverse to the direction of movement of the substrate to be coated.

The liquid zinc that is present in the retention vessel 4 is evaporated by a plasma generated in the confinement enclosure 5 in order to create a flow of zinc vapour towards a treatment zone 6 that the substrate to be coated passes through. This treatment zone 6 extends between an entry opening 7 and an exit opening 8 of the confinement enclosure 5 and corresponds to a passage that connects the openings 7 and 8 of the confinement enclosure 5. The treatment zone 6 is situated above the retention vessel 4 and communicates with the inside of the confinement enclosure 5 through the open walls of this passage, which thus form treatment openings.

The retention vessel 4 is supplied by means of a supply tube 9 passing through a gastight connection 10 situated between the vacuum tank 3 of the top equipment 1 and a second vacuum tank 11 of the bottom equipment 2. This supply tube 9 emerges in the bottom of the retention vessel 4 and is immersed in a liquid zinc reserve stored in a temperature-maintenance furnace 12 in the second vacuum tank 11.

As is clear in this FIG. 1, the confinement enclosure 5 according to the prior art does not comprise any device for regulating the flow of zinc vapour towards the various faces of the substrate that will be present in the treatment zone 6 or for blocking the passage of this vapour where no substrate is present in the treatment zone 6.

Figure 2:
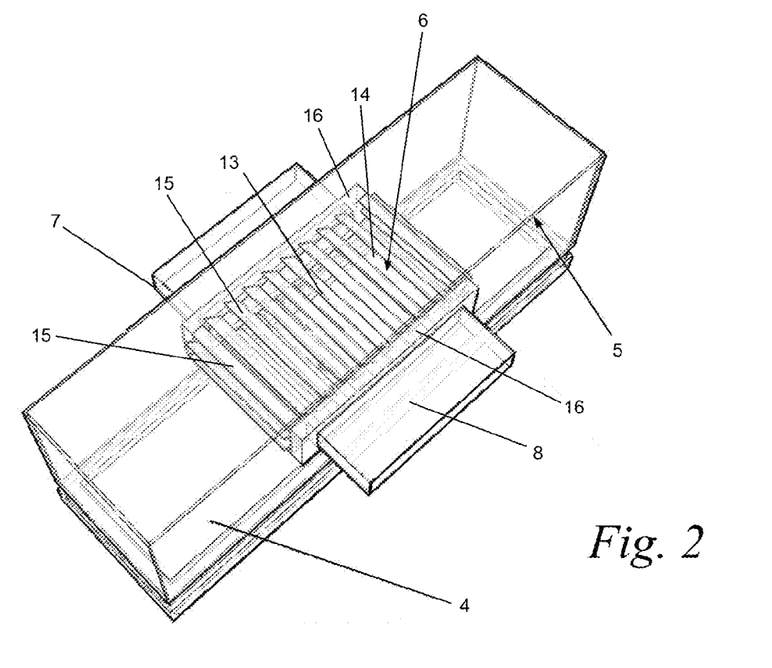
FIG. 2 is a schematic representation in perspective of a confinement enclosure according to the invention, the treatment zone of which, which is provided with obturation elements formed by articulated slats, extends between an entry opening and an exit opening of the enclosure.

FIG. 2 represents the confinement enclosure 5 with the treatment zone 6 of FIG. 1 having regulation means for controlling the flow of vapour from the coating material between the vapour source 4 and the treatment zone 6 through the treatment openings 14, according to an advantageous embodiment of the invention.

The space inside the confinement enclosure 5 makes it possible to distribute the vapour from the coating material all around the product to be coated and/or around the passage. Thus a free space is preferably present between the walls of the confinement enclosure and the walls of the passage allowing free circulation and a distribution of the vapour in the confinement enclosure.

The passage, which comprises the treatment zone 6, preferably has a tubular structure and is delimited by walls that extend between the entry opening 7 and the exit opening 8. Thus the walls of the passage surround the treatment zone 6. These walls have the treatment openings 14 and comprise the regulation means for closing or opening these treatment openings 14 and regulating the flow of vapour in directions transverse to the direction of movement of the substrate.

The regulation means comprise obturation elements 13 that can be moved between an open position which the flow of said vapour can pass through the treatment opening towards the treatment zone 6, and a closed position in which the treatment zone 6 is isolated with respect to the vapour source 4.

The walls of the passage, which extends in the direction of travel of the substrates between the entry opening 7 and the exit opening 8 of the confinement enclosure 5 and which comprises said treatment zone 6, are formed by obturation elements 13 that can be moved between an open position and a closed position. In the open position, the treatment opening is at least partially open and the flow of said vapour can enter inside the passage from the vapour source 4 through this treatment opening. In the closed position the inside of the passage, that is to say the treatment zone, is isolated by the obturation elements 13 with respect to the vapour source 4. Thus the walls of the passage can be moved between a closed position and an open position.

The obturation elements 13 are formed by slats 15 that are articulated with respect to the treatment opening so as to enable them to tilt between the open position and the closed position. The slats 15 have an oblong shape and their longitudinal direction extends parallel to the direction of movement of the substrates between the entry opening 7 and the exit opening 8 of the confinement enclosure 5.

Figure 3:
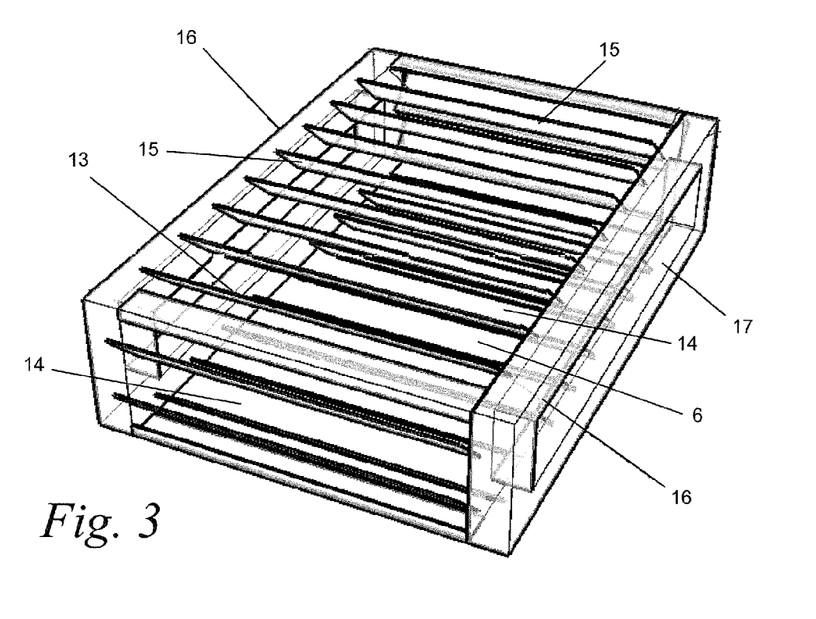
FIG. 3 is a schematic representation in perspective of the walls of the treatment zone, which are formed by a succession of articulated parallel slats, according to the invention.

In FIG. 3 the walls of the passage are shown. These walls comprise said obturation elements 13 formed by the slats 15 and thus constitute a kind of venetian blind that can close off the treatment opening in order to isolate the treatment zone with respect to the confinement enclosure 5.

The passage has a tubular structure composed of walls having rectangular slats 15 parallel to one another and fixed by a middle movable spindle in support frames 16. The support frames 16 have openings 17 that are adjacent to respectively the entry opening 7 and the exit opening 8 of the confinement enclosure 5 and enable the substrate to be coated to pass. By rotation about the median axis of the slats 15, the latter can be opened or closed like blinds. A device for causing the rotation of the slats is not shown for reasons of clarity of the figure. The rotation of each slat 15 can take place in a generally independent manner. This gives the greatest flexibility to the coating method. The device for driving the slats 15 can comprise for example motors or jacks, and is advantageously situated outside the confinement enclosure 5, in order not to be contaminated by the vapour produced by the vapour source 4.

Figure 4:
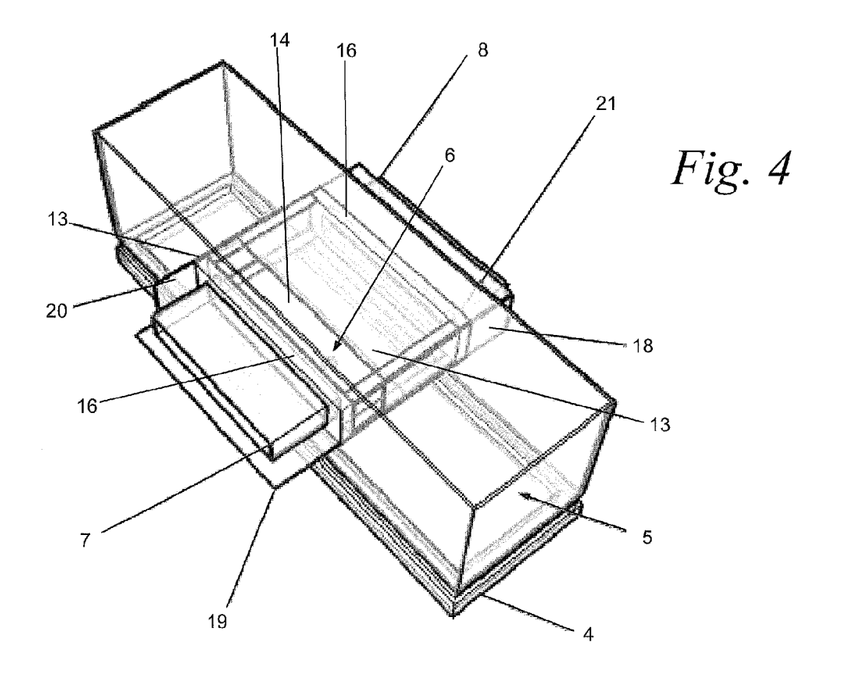
FIG. 4 is a schematic representation in perspective of a confinement enclosure with a treatment zone the walls of which are formed by obturation elements in the form of slides, according to the invention.

FIG. 4 shows a confinement enclosure 5 with a treatment zone 6 that is different from the one shown in FIG. 2 through the fact that the walls of the passage containing the treatment zone are formed by slides 18, 19, 20 and 21.

In this particular configuration of the device according to the invention, the slides 18, 19, 20 and 21 can be moved parallel to the central axis of the passage or, in other words, parallel to the direction of travel of the substrates through the treatment zone 6. By pulling these slides 18, 19, 20 and 21 outside the confinement enclosure 5, the opening enabling vapour to pass towards the treatment zone in a direction perpendicular to the pulled slide is opened proportionally to the pulled area of the slide 18, 19, 20 or 21 concerned outside the confinement enclosure 5. The slides 18, 19, 20 and 21 are brought inside the enclosure 5 in order to close off the entire treatment opening and to prevent the passage of vapour towards the treatment zone 6 when no substrate is passing through this treatment zone 6, and thus to minimise the vapour losses towards the outside.

It is also possible for the walls or slides of the passage to consist of one or more slats extending alongside each other to allow a more precise regulation of the vapour flow around the substrate. In such a case, each slat can be moved individually parallel to the direction of travel of the substrates.

The slides 18, 19, 20 and 21 are formed by plates that are for example actuated by means of jacks, not shown, and fixed to the external walls of the enclosure 5.

Figure 5:
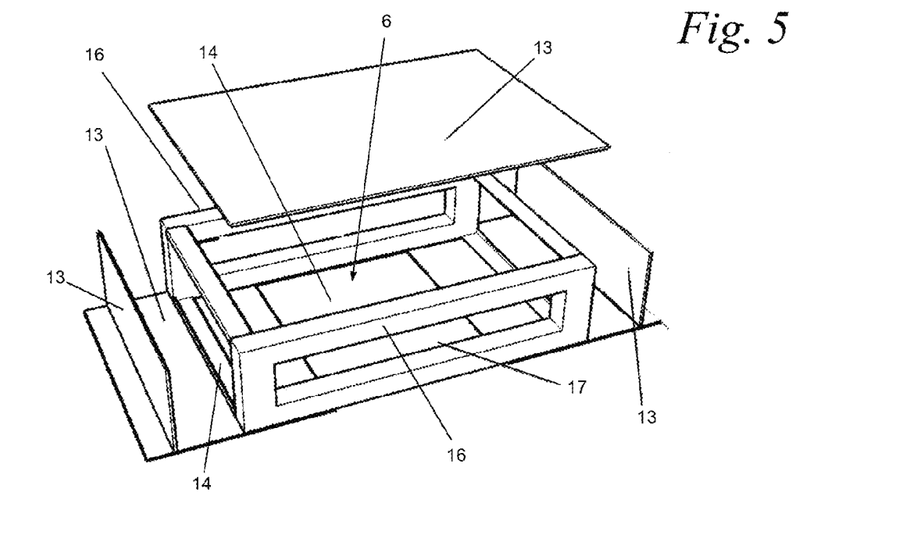
FIG. 5 is a schematic representation in perspective of a confinement enclosure with a treatment zone the walls of which form flat obturation elements that can be moved in parallel or perpendicularly with respect to their plane, according to the invention.

FIG. 5 shows a treatment zone 6 that is provided in a passage, the walls of which form flat obturation elements 13 that can be moved in parallel or perpendicularly with respect to the plane thereof.

This particular configuration of the device according to the invention illustrates the fact that the obturation elements can be moved generally in any manner. For example, perpendicular to their plane inside the confinement enclosure 5 as is the case with the top obturation element and the two lateral obturation elements. The bottom wall comprises for example two obturation elements 13 that can be moved in their own plane and perpendicular to the direction of movement of the substrates, not shown. The substrates can travel through the openings 17 present in the support frame 16 on each side of the treatment zone 6.

Figure 6:
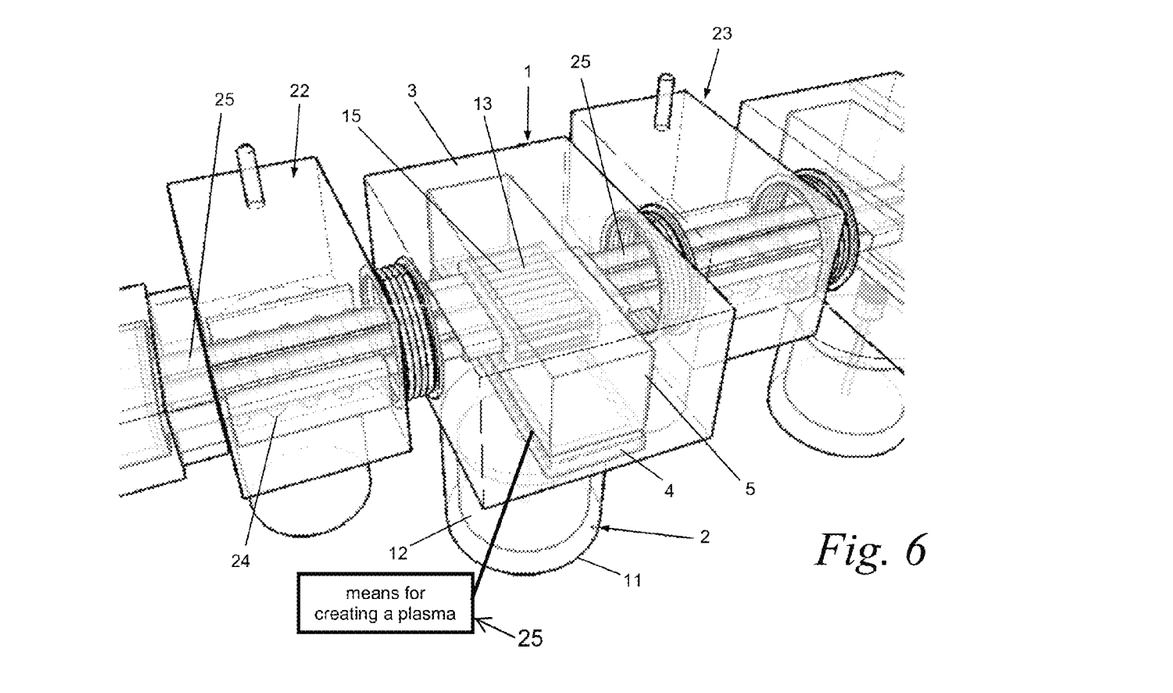
FIG. 6 is a schematic representation of a particularly advantageous form of the device according to the invention in a plasma galvanisation installation, when substrates pass through the treatment zone and the obturation elements are in their open position.
Figure 7:
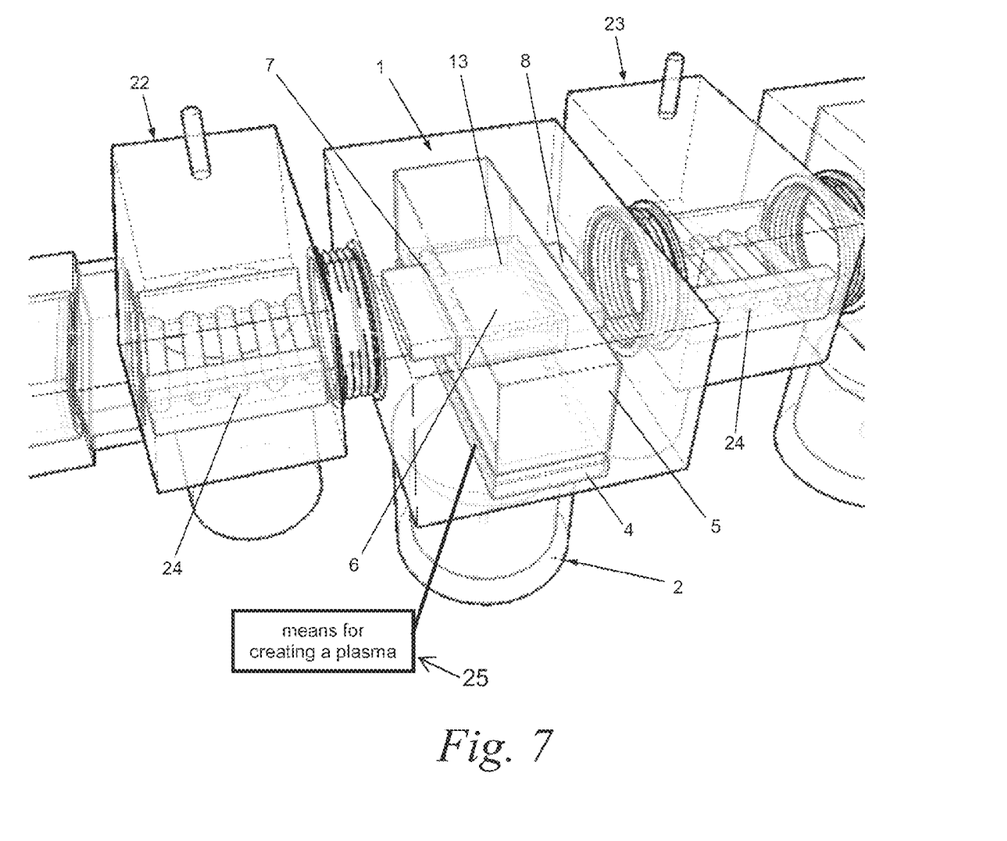
FIG. 7 shows a device according to the invention of FIG. 6 in the absence of substrates and when the obturation elements are in their closed position.

FIGS. 6 and 7 show the device according to the invention, in a plasma galvanisation installation. This installation comprises in particular a system for transporting the substrates by banks of motorised rollers 24 mounted in a vacuum tank 22 and 23 downstream and upstream of the device according to the invention, comprising the retention vessel 4 surmounted by the confinement enclosure 5 having the treatment zone 6. Naturally other transport systems can be envisaged such as a monorail transport system for suspending the substrates and transporting them through the various zones of the installation. Means (26) are provided for creating a plasma in the confinement enclosure (5) so as to evaporate the coating material and to polarise the latter on average negatively with respect to a counter-electrode.

The substrates are introduced into the installation by means of a vacuum airlock, not shown, which makes it possible to continuously maintain the treatment zone 6 and the confinement enclosure 5 under vacuum or under the required argon pressure and thus avoids contaminating the treatment zone through the introduction of air. The required argon pressure is typically between 0.05 and 5 Pa.

The substrates leave the installation by means of an exit vacuum airlock that is also not shown in the figures.

The device according to the invention shown in FIGS. 6 and 7 uses a system for regulating the vapour flow having obturation elements 13 in the form of slats 15. This system for regulating the flow of vapour of the coating material is shown in FIGS. 2 and 3. When the substrates 25 to be galvanised pass through the treatment zone 6 of the top equipment 1, the slats 15 are open in order to enable the zinc vapour to pass towards the substrates 25, as shown in FIG. 6.

In the absence of a substrate 25 passing through the treatment zone 6, the slats 15 for regulating the flow of zinc vapour towards the treatment zone 6 are totally closed in order to limit to the maximum extent the zinc vapour losses in the vacuum chamber 3, as shown in FIG. 7. Thus the walls of the passage are in their closed position so that the treatment zone 6 is isolated with a respect to the inside of the confinement enclosure 5 where the vapour of the coating material is present.

4. OPERATIONAL CONDITIONS AND PARTICULAR CONFIGURATIONS OF THE INVENTION IN A PLASMA GALVANISATION INSTALLATION 4.1. Starting the Plasma Evaporation Zinc Plating Unit When the plasma evaporation zinc plating installation is put under vacuum after maintenance, the obturation elements formed by the flaps 13 of the baffles of the vapour regulation device are arranged in positions such that the adjustable openings of the device are open to the maximum to enable the evacuation of the air and then the required pressurisation of argon inside the confinement enclosure. When the installation reaches an argon pressure of between 0.001 and 0.01 mbar the walls of the confinement enclosure are heated by electric elements to a temperature of between 400° and 500° C. The flaps 13 of the baffles of the zinc vapour flow regulation device according to FIGS. 2 and 3 are actuated by rotation so as to close the openings and thus optically isolate the treatment zone 6 from the inside of the confinement enclosure. The flaps 13 of the baffles of the vapour regulation device are heated by the infrared radiation emitted by the internal walls of the confinement enclosure 5. Advantageously, a few flaps 13 are provided with thermocouples for monitoring the temperature thereof. When the working temperature is reached on the flaps 13 (typically between 400° and 500° C.) the liquid zinc is introduced to its set level measured by generally any electrical, optical or mechanical means, in the retention vessel 4.

4.2. Particular Device for Driving the Obturation Elements Consisting of Successive Slats that can be Swung Between an Open Position and a Closed Position for Regulating the Zinc Vapour Flow Transversely to the Direction of Movement of the Substrate In a particularly advantageous form of the invention, the obturation elements 13 formed by slats 15, as shown in FIGS. 2 and 3, are supported on spindles fixed to the support 16. The rotation of a group of slats 15 is made integral by generally any means, such as for example a chain, cables or a lever cooperating with a runner. This is done for the four walls of the passage that extend parallel to the direction of travel of the substrates. In this way the device can be opened in a regulated fashion. In particular, the treatment opening for each of the walls of the passage containing the treatment zone can be opened and closed independently. These walls are respectively situated above, below and laterally with respect to the treatment zone 6 of the substrate and extend between the entry opening 7 and the exit opening 8. Advantageously, the mechanical driving of the obturation elements 13 is done by means of four independent devices fixed to the external walls of the confinement enclosure 5 maintained at ambient temperature (approximately 300K) via four transmissions passing through the walls of the confinement enclosure 5. The mechanical drive devices may be jacks or rotary devices and may generally be electromechanical, pneumatic or hydraulic.

The advantage of this particular configuration of the device according to the invention is to be able to regulate zinc vapour flow by direction according to the area of the substrate to be coated dependent on the transverse direction in question for a substrate of given geometry. It is in particular possible to regulate the distribution of the passage of the vapour towards the treatment zone according to the transverse section of the substrates to be coated.

Thus, for example, for a steel substrate with a U-shaped transverse section, the opening of which is oriented upwards and the principal dimensions in cross section of which are equivalent, ignoring the thickness of the substrate, it is necessary to have a zinc vapour flow that is three times greater through the wall of the passage situated above the substrate than through the walls situated below and on the sides of the substrate since the internal surface of the U is three times greater than each of the lateral and bottom surfaces. The internal surface of the U is essentially coated with zinc passing through the top wall. This top wall will therefore be totally open whereas the lateral walls and the bottom wall will be partially closed.

In general, the degree of closure of each wall depends not only on the geometry of the substrate but also on the size of the substrate with respect to the transverse dimensions of the cross section of the passage constituting the treatment zone, the number and distribution of the substrates in the treatment zone when several substrates are treated in parallel, and the proximity of the vapour source with respect to each wall.

By way of example, if three substrates, with a U-shaped transverse section as described above, are treated in parallel and distributed at equal distances in the treatment zone, the characteristic openings of the walls that might lead to a uniform coating over all the faces of the substrate could typically be: 100% opening for the top surface, 60% for the bottom surface and 20% for the two lateral surfaces.

In the case of the zinc plating of a steel sheet or plates, for the purpose of obtaining a thickness of deposit that is uniform on the two faces of a sheet or plate moving horizontally in the treatment zone 6 above the retention vessel 4, it will be necessary to completely open the obturation elements 13 situated above the sheet or plate and partially close the obturation element situated between the retention vessel and the sheet or plate so as to regulate the flows of zinc vapour in the confinement enclosure and to obtain an identical zinc vapour flow on the two faces of the sheet or plate. In general, the obturation element situated opposite the lateral edges of the sheet or plate are not necessary for the application of the device according to the invention to the zinc plating of a steel sheet or plates. Use can advantageously be made of fixed left and right lateral walls closing off any passage of vapour in a direction perpendicular to these walls.

4.3. Management of the Plasma Evaporation Zinc Plating Unit Provided with a Device According to the Invention in Operating Mode When no substrate is situated in the treatment zone 6 inside the passage, the obturation elements 13 are held in positions such that all the walls or treatment openings are closed.

When the substrate is detected as being situated partially or totally inside the treatment zone by one or other or both detectors situated in the vicinity of the entry and exit openings 7 and 8, the obturation elements 13 are actuated to enable the walls to open, thus providing passage of the zinc vapour towards the substrate to a required degree according to the required zinc vapour flow and/or according to the orientation of the obturation elements with respect to the direction of travel of the substrate. The degree of opening of the obturation elements is generally pre-regulated according to the characteristics of the substrates to be treated, for example according to the geometry and number of substrates treated in parallel.

When the obturation elements 13 open, the electrical supply (means for creating plasma 25) connected to the retention vessel 4 and to an anode, not shown and situated in the confinement enclosure 5 between the retention vessel 4 and the passage comprising the treatment zone, and enabling plasma to be obtained in the zinc vapour necessary for the evaporation of the liquid zinc introduced into this retention tank, is triggered. The power delivered to the plasma by this electrical supply is increased according to a pre-established program up to its nominal power when the two entry and exit detectors are activated by the substrate. Finally, when only the detector situated in the vicinity of the exit opening 8 of the enclosure 5 is activated by the substrate, the power delivered by this electrical supply is reduced until it is cut off according to a pre-established program. When the substrate has completely left the treatment zone and is no longer detected by the detector situated in the vicinity of the entry and exit openings 7 and 8 of the confinement enclosure 5, the obturation elements 13 are actuated in order to completely close off the treatment openings in the walls of the passage and thus minimise the zinc vapour losses outside the confinement enclosure 5.

An important advantage of the method according to the invention, afforded by the closure of the treatment zone with respect to the confinement enclosure containing the zinc vapour, when no substrate is passing through it or travelling therein, is that, preventing the losses of zinc by evaporation to the treatment zone of the substrate, the system is maintained at thermodynamic equilibrium, at the temperature of the walls of the confinement enclosure, without having to maintain the electrical power in the plasma, while preventing any risk of solidification of the liquid zinc in the retention vessel.

4.4. Stoppage of the Plasma Evaporation Zinc Plating Unit Provided with the Device for Regulating the Vapour Flow When the plasma evaporation galvanisation unit is stopped, no substrate any longer being detected in the treatment zone, the obturation elements are in the closed position. The retention vessel 4 is then emptied to its temperature-maintenance furnace 12 via the supply tube 9. When the vessel 4 is emptied of all liquid zinc, the obturation elements are completely open in order to enable gases to pass between the inside and outside of the confinement enclosure 5. The heating elements of the confinement enclosure are then cut off in order to enable the internal walls of the enclosure to cool before the installation is opened to atmosphere for maintenance.

5. EXAMPLES OF PRACTICAL APPLICATIONS 5.1. Installation for the Plasma Evaporation Galvanisation of Steel Profiles An installation for galvanising steel profiles by plasma evaporation is equipped with confinement chambers provided with a device for regulating the zinc vapour flow with articulated slats 15, as shown in FIGS. 2 and 3. The vapour flow regulator is provided with four independent walls affording independent regulation of the zinc vapour flow respectively above, below and on the sides of the charge passing through the treatment zone. The obturation elements of the four walls corresponding to the four principal transverse orientations in the direction of travel of the charge to be galvanised are actuated by rotation of the corresponding slats 15 by means of jacks (not shown) fixed to the external walls of the confinement enclosure 5. The cross section of the opening 17 for the passage of the substrates at the support frames 16 measures typically 700 mm×200 mm and the dimension of the passage or of the treatment zone parallel to the direction of travel of the substrate measures 600 mm. When the substrates are detected as passing through the treatment zones, the slats 15 are opened for each of the four independent walls according to a degree of opening allowing uniform coating of the substrates on all their faces. Typically, the wall situated above the substrates is 100% open, the wall situated below the substrates is 80% open, and the lateral walls are 50% open. When the charge has completely left the treatment zone, the independent obturation elements are completely closed and the electrical supply connected between the retention vessel and the anode facing it (not shown) is cut so as to minimise as far as possible the zinc losses towards the outside of the confinement enclosure. This device for regulating the zinc vapour flow affords transverse regulation around the charge of a nominal flow of zinc vapour of around 3.5 kg per minute.

5.2. Installation for the Plasma Evaporation Galvanisation of Running Steel Sheets An installation for the galvanisation of running steel sheets by plasma evaporation is equipped with confinement chambers through which a 1 mm thick and 1 m wide steel sheet passes horizontally, at a speed of the 100 m/min, one side of the sheet facing the retention vessel 4. Each confinement enclosure has a zinc vapour flow regulation device provided with a top slide baffle situated above the sheet and a bottom slide baffle situated below the sheet, as shown in FIG. 4, and actuated independently by fixed jacks on the external walls of the confinement enclosure (not shown). The lateral walls of the zinc vapour regulation device are fixed given the flat geometry of the sheet. The internal dimensions of the vapour flow regulation device are 1100× 50 mm for the opening 17 in the support frames 16 and 600 mm for the longitudinal dimension in the direction of movement of the sheet. In operation, in order to have a deposit of uniform thickness over the entire surface of the sheet, the top slide is 100% open whereas the bottom slide is open only by 70% of its total opening.

This device is particularly advantageous for the galvanisation of steel sheets since it also makes it possible to completely dispense with the need to use accumulators generally necessary in continuous coating processes during changes of steel reel, which constitutes a very significant saving in investment. This is because, when the travel of the belt stops, in addition to the cutting of the electrical supply enabling plasma zinc evaporation, the complete closure of the top and bottom slides of the vapour flow regulation device completely protects the sheet from any deposition of zinc during the belt stoppage time and thus ensures not only the production of a uniform thickness of zinc over the entire substrate but also the quality of the deposition since the latter is effected only in the presence of a plasma. It is well known that the presence of ions during a process of vacuum condensation of a metal on a substrate improves the quality of the coating.

This device for regulating the zinc vapour flow allows the regulation, to the two faces of the sheet, of a nominal flow of zinc vapour of around 3.5 kg per minute.

It goes without saying that the invention is not limited solely to the geometries and mechanisms of the vapour flow regulation devices described above but also considers generally any geometries and mechanisms; for example, the obturation elements 13 could have their rotation axis fixed in generally any direction and not only parallel to the axis of travel of the substrate. Means other than the slats 15 or slides 18-21 can be used, for example rotary or iris diaphragms actuated in the plane of the wall where they are provided, etc.

The invention claimed is:

1. A device for the coating of running substrates moving in a direction of travel, the device comprising:
   a confinement enclosure with an entry opening and an exit opening through which the substrates pass;
   a source of vapour of the coating material disposed in the confinement enclosure,
   a treatment zone defined by a tubular passage delimited by walls that extend between the entry opening and the exit opening in the confinement enclosure communicating with the source of vapour through at least one treatment opening in the walls, the source of vapour being configured and operable to generate a vapour flow for coating the substrates;
   a regulation unit to control flow of said vapour through said treatment opening between an inside of the confinement enclosure and an inside of the tubular passage,
   wherein the regulation unit comprises obturation elements connected to be moved between an open position in which the flow of said vapour can pass from the confinement enclosure through the treatment opening towards the passage and the treatment zone and a closed position in which the treatment zone is isolated with respect to the confinement enclosure and the source of vapour, the confinement enclosure being configured to allow free circulation and distribution of the vapour around the passage,
   wherein the obturation elements comprise slats having an oblong shape, the longitudinal direction of which extends parallel to the direction of travel of the substrates between the entry opening and the exit opening of the confinement enclosure;
   wherein the slats comprise a succession of parallel slats forming venetian blinds;
   wherein in the open position, each of the slats extend at a distance from one another enabling the flow of the vapour to pass between the slats towards the treatment zone and in the closed position, touch one another to close the treatment opening and isolate the vapour source with respect to the treatment zone by rotation of the slats.

2. The device according to claim 1, further comprising a free space defined between the walls of the confinement enclosure and the walls of the passage allowing free circulation and a distribution of the vapour in the confinement enclosure around the passage.

3. The device according to claim 1, wherein the tubular passage extends in the direction of travel of the substrate.

4. The device according to claim 1, wherein the walls consist at least partially of said obturation elements that can be moved gradually between the open position, in which the flow of said vapour enters inside the tubular passage from the vapour source through the treatment opening, and a closed position in which the inside of the tubular passage is isolated with respect to the vapour source.

5. The device according to claim 1, wherein each of the slats are articulated with respect to the treatment opening and are thus capable of being controlled to tilt between the open position and the closed position.

6. The device according to claim 1, wherein the obturation elements can be actuated independently with respect to one another to regulate distribution of the vapour flow towards the treatment zone according to a cross section of the substrates to be coated.

7. The device according to claim 1, wherein the walls are maintained at a sufficiently high temperature to prevent condensation of the vapour of the coating material on the walls.

8. The device according to claim 1, wherein the confinement enclosure comprises heated walls to prevent the coating material from being deposited on the walls.

9. The device according to claim 1, further comprising a vacuum chamber in which the confinement enclosure and the treatment zone are disposed.

10. The device according to claim 1, further comprising means for creating a plasma in the confinement enclosure so as to evaporate the coating material and to polarise the latter on average negatively with respect to a counter-electrode.

11. The device according to claim 1, wherein the vapour source comprises a retention vessel containing a metal in the liquid state.

12. Device according to claim 11, in which the retention vessel is supplied with liquid zinc via a supply tube immersed in a zinc reserve maintained in a vacuum furnace situated in a vacuum chamber.

13. The device according to claim 1, wherein the vapour source comprises a retention vessel containing zinc in the liquid state.

* * * * *